United States Patent
Sareen et al.

(10) Patent No.: US 12,126,260 B2
(45) Date of Patent: Oct. 22, 2024

(54) PULSE SKIPPING IN OSCILLATOR-BASED FREQUENCY MODULATING DC-TO-DC CONVERTERS

(71) Applicant: TEXAS INSTRUMENTS INCORPORATED, Dallas, TX (US)

(72) Inventors: Puneet Sareen, Freising (DE); Narayanan Seetharaman, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 441 days.

(21) Appl. No.: 17/514,951

(22) Filed: Oct. 29, 2021

(65) Prior Publication Data

US 2023/0133452 A1    May 4, 2023

(51) Int. Cl.
*H02M 3/158*      (2006.01)
*G01R 19/165*     (2006.01)
(Continued)

(52) U.S. Cl.
CPC .... *H02M 3/1584* (2013.01); *G01R 19/16538* (2013.01); *G05F 1/561* (2013.01);
(Continued)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135;
(Continued)

(56) References Cited

U.S. PATENT DOCUMENTS 7,170,273 B2 *  1/2007  Sase ...................... H02M 3/156
                                              323/283
8,018,742 B2 *  9/2011  Lin .................... H02M 3/33507
                                              363/21.01

(Continued)

*Primary Examiner* — Jeffrey A Gblende
(74) *Attorney, Agent, or Firm* — Ray A. King; Frank D. Cimino

(57) ABSTRACT

In an example, a system includes a switching voltage converter including a first field effect transistor (FET) and a second FET, the switching voltage converter configured to receive an input voltage and provide an output voltage. The system also includes a voltage to current converter coupled to the switching voltage converter and an oscillator, the voltage to current converter configured to receive an error voltage of the output voltage and provide an oscillator current to the oscillator. The system includes a comparator coupled to the oscillator and configured to compare the oscillator current to a reference current, where an output of the comparator is configured to skip a pulse of an oscillator output responsive to the oscillator current being less than the reference current.

19 Claims, 3 Drawing Sheets

(51) Int. Cl.
*G05F 1/56* (2006.01)
*H02M 1/00* (2006.01)
*H03K 5/24* (2006.01)

(52) U.S. Cl.
CPC ....... *H02M 1/0009* (2021.05); *H02M 1/0012* (2021.05); *H02M 1/0025* (2021.05); *H03K 5/24* (2013.01)

(58) Field of Classification Search
CPC ........ H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H02M 1/0048; H05B 39/048; B23K 11/24; H04B 2215/069
See application file for complete search history.

(56) References Cited

U.S. PATENT DOCUMENTS

| | | | | |
|---|---|---|---|---|
| 8,339,814 | B2* | 12/2012 | Zhang | H02M 3/33507 |
| | | | | 363/21.13 |
| 9,236,727 | B2* | 1/2016 | Fukui | H02M 3/156 |
| 9,444,336 | B2* | 9/2016 | Fukumoto | H02M 3/156 |
| 2008/0106917 | A1* | 5/2008 | Holt | H02M 3/157 |
| | | | | 363/26 |
| 2009/0021227 | A1* | 1/2009 | Sase | H02M 1/36 |
| | | | | 323/283 |

* cited by examiner

PULSE SKIPPING IN OSCILLATOR-BASED FREQUENCY MODULATING DC-TO-DC CONVERTERS

BACKGROUND

Voltage converters, such as direct current to direct current (DC-to-DC) converters, convert a source voltage at an input to another voltage at an output. Voltage converters can step down voltage from the input to the output, step up voltage, or both. With pulse frequency modulation (PFM), a pulse train of relatively fixed-size pulses drives the voltage converter. The frequency of the pulses is varied based on the load. Higher frequencies are useful for heavy loads, and lower frequencies are useful for lighter loads.

SUMMARY

In accordance with at least one example of the description, a system includes a switching voltage converter including a first field effect transistor (FET) and a second FET, the switching voltage converter configured to receive an input voltage and provide an output voltage. The system also includes a voltage to current converter coupled to the switching voltage converter and an oscillator, the voltage to current converter configured to receive an error voltage of the output voltage and provide an oscillator current to the oscillator. The system includes a comparator coupled to the oscillator and configured to compare the oscillator current to a reference current, where an output of the comparator is configured to skip a pulse of an oscillator output responsive to the oscillator current being less than the reference current.

In accordance with at least one example of the description, a system includes a switching voltage converter including a first FET, a second FET, and a gate driver coupled to a gate of the first FET and a gate of the second FET. The system also includes a voltage to current converter coupled to an output of the switching voltage converter. The system includes an oscillator coupled to the voltage to current converter. The system also includes an AND gate having an AND gate output and first and second AND gate inputs, the AND gate output coupled to a latch, the first AND gate input coupled to the oscillator, and the second AND gate input coupled to a comparator, where the latch is coupled to the gate driver.

In accordance with at least one example of the description, a method includes receiving an input voltage and producing an output voltage with a switching voltage converter. The method includes determining a voltage error of the output voltage. The method also includes providing a current to an oscillator based at least in part on the voltage error. The method includes, responsive to the current, skipping a pulse provided by the oscillator to reduce a frequency of pulses from the oscillator.

DETAILED DESCRIPTION

Figure 1:
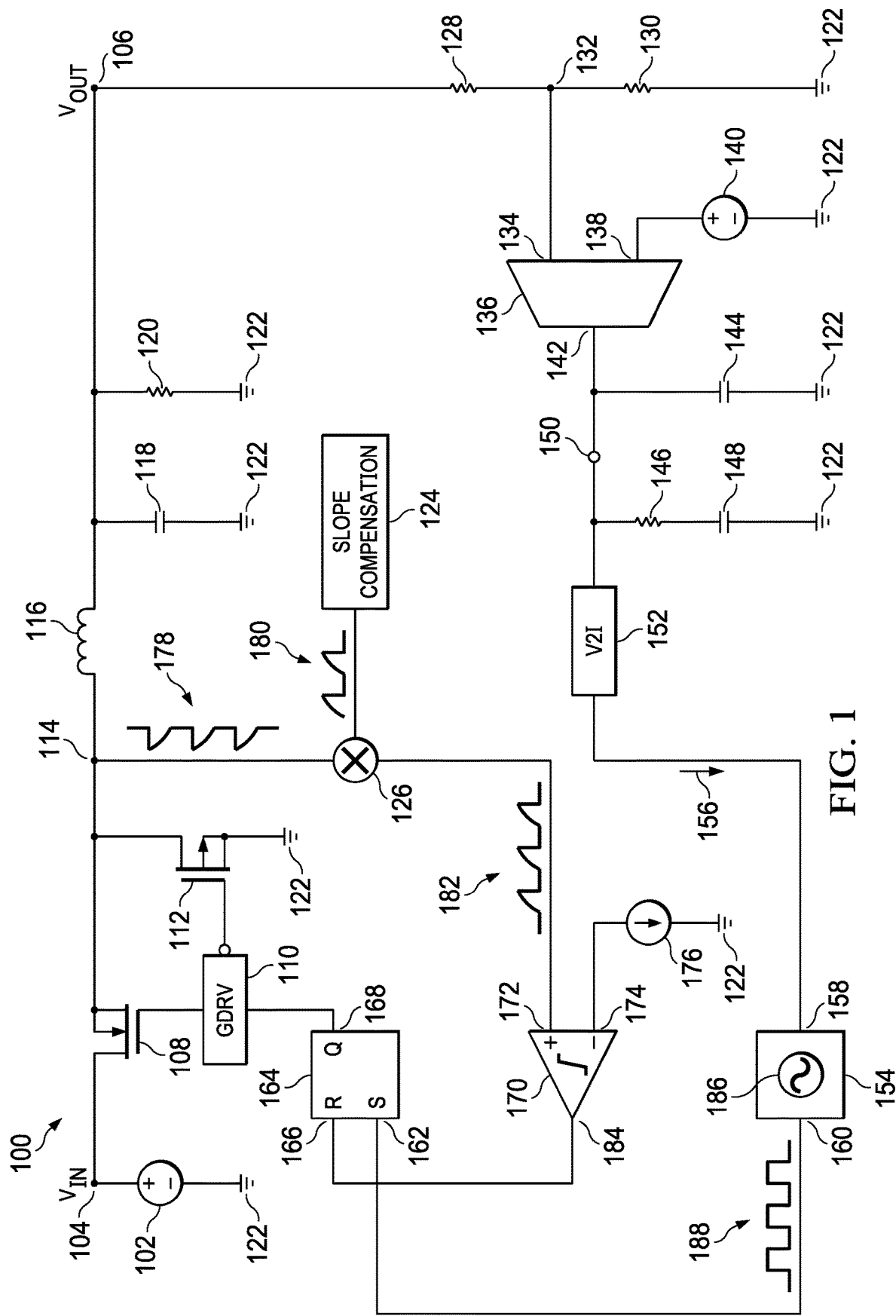
FIG. 1 is a circuit diagram of a PFM-based switching voltage converter in accordance with various examples.

A PFM-based switching voltage converter or switching voltage regulator receives an input voltage and produces an output voltage. The switching voltage converter turns power transistors, which are often metal-oxide semiconductor field effect transistors (MOSFETs), on and off rapidly in order to provide the output voltage and output current. Control circuitry provides PFM signals to the power transistors to control the on and off state of the transistors. The switching voltage converter may be a buck converter, a boost converter, or a buck-boost converter.

An oscillator is useful for producing a clock signal that controls the turn-on and turn-off cycles for the power transistors. A compensation circuit adjusts the frequency of the oscillator responsive to the load. The oscillator may be a current controlled oscillator (ICO) or a voltage controlled oscillator (VCO). A heavy load increases the frequency of the oscillator. A light load reduces the frequency of the oscillator. With a light load, the oscillator may run slowly, such as 10 Hertz (Hz) or 100 Hz. If the load increases, the oscillator may have to ramp up quickly from 10 Hz to 1 kilohertz (kHz) or more. Circuit parasitics may prevent the oscillator from ramping up quickly, which creates a limited response time for the voltage converter. The output voltage may be unregulated during the time it takes for the oscillator to reach the higher frequency.

In examples herein, a PFM-based switching voltage converter includes an oscillator that is prevented (or clamped) from running slower than a predetermined frequency. For example, the minimum frequency for the oscillator may be set at 1 kHz. To regulate the output voltage with a light load, the oscillator may operate at a frequency less than 1 kHz. The frequency of the oscillator output pulses is reduced below the minimum frequency by skipping clock cycles. Skipping refers to not providing an oscillator output pulse to the rest of the circuitry, but rather blocking the pulse in some manner. Any frequency below the minimum frequency may be achieved by skipping clock cycles (e.g., pulse skipping). For example, if the oscillator is running at a nominal frequency of 1 kHz, skipping or blocking every other pulse reduces the frequency of the output pulses to 500 Hz. Similarly, if the oscillator is running at 1 kHz, skipping or blocking nine out of ten pulses reduces the frequency of the output pulses to 100 Hz. Any combination or pattern of pulses or consecutive pulses may be skipped according to the examples herein to produce the proper frequency to drive the load.

By keeping the oscillator frequency at or above the minimum frequency, the oscillator can ramp up in frequency more quickly responsive to an increase in the load. Stability of the voltage converter is increased by the ability of the oscillator to quickly increase frequency responsive to the change in load. In examples herein, precise control of the oscillator is achieved, and the voltage converter exhibits a fast response to changes in the load. In examples herein, the same reference numbers or other reference designators are used in the drawings to designate the same or similar (functionally and/or structurally) features.

FIG. 1 is a circuit diagram of a PFM-based switching voltage converter 100 in accordance with various examples herein. Voltage converter 100 includes an input voltage source 102 that produces an input voltage $V_{in}$ at node 104. Voltage converter 100 produces an output voltage $V_{out}$ at node 106. A high-side FET 108 is coupled to the input voltage source 102, a gate driver (GDRV) 110, and a low-side FET 112. Gate driver 110 includes any circuitry configured to provide a voltage to the gates of high-side FET 108 and low-side FET 112. A source of high-side FET 108 is coupled to node 114, which is also coupled to a drain of low-side FET 112. An output inductor 116 is coupled to node 114, and the output inductor 116 is also coupled to capacitor 118. A load 120 is coupled between node 106 and ground 122. Capacitor 118 and low-side FET 112 are also coupled to ground 122.

Voltage converter 100 includes a slope compensation unit 124 and an adder 126. Node 106, where output voltage $V_{out}$ is produced, is coupled to resistor 128. Resistor 128 is also coupled to resistor 130, which is coupled to ground 122. Node 132 is coupled between resistors 128 and 130. Node 132 is coupled to a first comparator input 134 of a comparator 136. A second comparator input 138 of comparator 136 is coupled to a voltage source 140, which is also coupled to ground 122. A comparator output 142 of comparator 136 is coupled to a capacitor 144 and a resistor 146. Resistor 146 is coupled to a capacitor 148, which is also coupled to ground 122. Comparator 136 produces an error value 150 (e.g., an error voltage or voltage error) in one example. Voltage to current converter (V2I) 152 is coupled to comparator output 142 of comparator 136, and receives error value 150.

V2I 152 is coupled to oscillator control 154. V2I 152 provides a current 156 to a first input 158 of oscillator control 154. An output 160 of oscillator control 154 is coupled to a first input 162 of latch 164 (e.g., a set input S). Latch 164 includes a second input 166 (e.g., a reset input R) and an output 168 (e.g., Q). Voltage converter 100 also includes a comparator 170 with a first input 172 coupled to adder 126. A second input 174 of comparator 170 is coupled to a current source 176.

In operation, latch 164 provides a signal to the gate driver 110 to turn high-side FET 108 and low-side FET 112 on and off to produce an output voltage $V_{out}$ at node 106. A ramp waveform 178 is produced at node 114, which represents a current through output inductor 116. Slope compensation unit 124 also produces a ramp waveform 180. Ramp waveform 178 and ramp waveform 180 are added with adder 126. Adder 126 produces waveform 182, which is provided to first input 172 of comparator 170. Waveform 182 is compared to a provided current from current source 176. Current source 176 produces a peak control current. Each time the value of waveform 182 crosses the peak control current value, a clock signal is provided from output 184 of comparator 170. The clock signal is provided to second input 166 (R input) of latch 164 and resets latch 164. After latch 164 is reset, gate driver 110 changes the FET (either high-side FET 108 or low-side FET 112) that is turned on.

Oscillator control 154 includes an oscillator 186 and additional circuitry (shown in FIG. 2) that produces a clock signal 188 with a set frequency (e.g., the oscillator output). The clock signal 188 sets the turn-on cycle for FETS 108 and 112. The cycle begins with the oscillator 186 producing a rising edge. The rising edge turn on high-side FET 108. A current through output inductor 116 rises, and comparator 170 trips. Latch 164 resets, which turns off high-side FET 108. Low-side FET 112 is turned on, and the current through output inductor 116 falls. Then, the next cycle begins with a rising edge from oscillator 186 turning on high-side FET 108 again.

The tripping point of comparator 170 is fixed by the current source 176, which also fixes the tripping point of latch 164 and FETS 108 and 112. The current through output inductor 116 ramps up, reaches the trip point, and then falls after low-side FET 112 turns on. This process repeats during steady state operation. If the load 120 is a light load, the current through output inductor 116 falls more gradually. Responsive to this, the oscillator 186 should reduce its frequency so latch 164 does not trip too soon and can sustain the gradual drop in the load current. Therefore, frequency modulation of the oscillator 186 is performed with voltage converter 100 based on the size of the load 120. The pulse width will not change, but the frequency of the pulses will change during operation.

Oscillator 186 changes frequency by sensing that load 120 has dropped. A voltage $V_{out}$ is sensed at node 106, and if the load current increases, $V_{out}$ drops. The drop in $V_{out}$ is sensed by the compensation components (such as resistors 128 and 130, comparator 136, etc.). A voltage produced at the comparator output 142 of comparator 136 represents an error value 150 that represents a compensation value for voltage converter 100. Error value 150 is the error between a reference voltage produced by voltage source 140 and $V_{out}$. Error value 150 is converter to a current by V2I 152. The current 156 produced by V2I 152 is provided to oscillator 186 which increases the amount of current in oscillator 186, which speeds up oscillator 186 (oscillator 186 is a current controlled in this example). A larger error value 150 produces a larger current 156. In some examples, V2I 152 may include an upper limit of the current 156 that is provided to oscillator 186 to set a maximum frequency at which oscillator 186 may operate.

If load 120 is small, $V_{out}$ is small, and error value 150 is also likely to be small. Therefore, the current 156 provided to oscillator 186 is small, and the frequency of oscillator 186 goes down. If the load is light (for example, under 100 microamps), oscillator 186 may run slowly, such as below 100 Hz or even below 10 Hz. Current 156 provided to oscillator 186 may be in the nanoamp range. If load 120 increases, oscillator 186 has to ramp up its frequency from its low value such as 10 Hz to a higher speed such as 100 kHz or higher. Parasitics may prevent the oscillator from ramping up quickly, which creates a limited response time for voltage converter 100. $V_{out}$ may not be regulated during this ramp-up period.

In examples herein, oscillator 186 is prevented from running slowly, such as a speed of 100 Hz or 10 Hz. Rather, oscillator 186 is clamped so it has a minimum speed, such as 100 kHz. To compensate for changes in load 120, pulses of the oscillator 186 may be skipped as described herein to simulate frequencies lower than 100 kHz. Therefore, the oscillator 186 may have a frequency range of 10 kHz to 1 MHz, or 100 kHz to 1 MHz, or any other suitable range. Circuitry within oscillator control 154 may be configured to perform the skipping of pulses in one example, as described below. Any suitable method may be useful for skipping pulses according to the examples herein.

Figure 2:
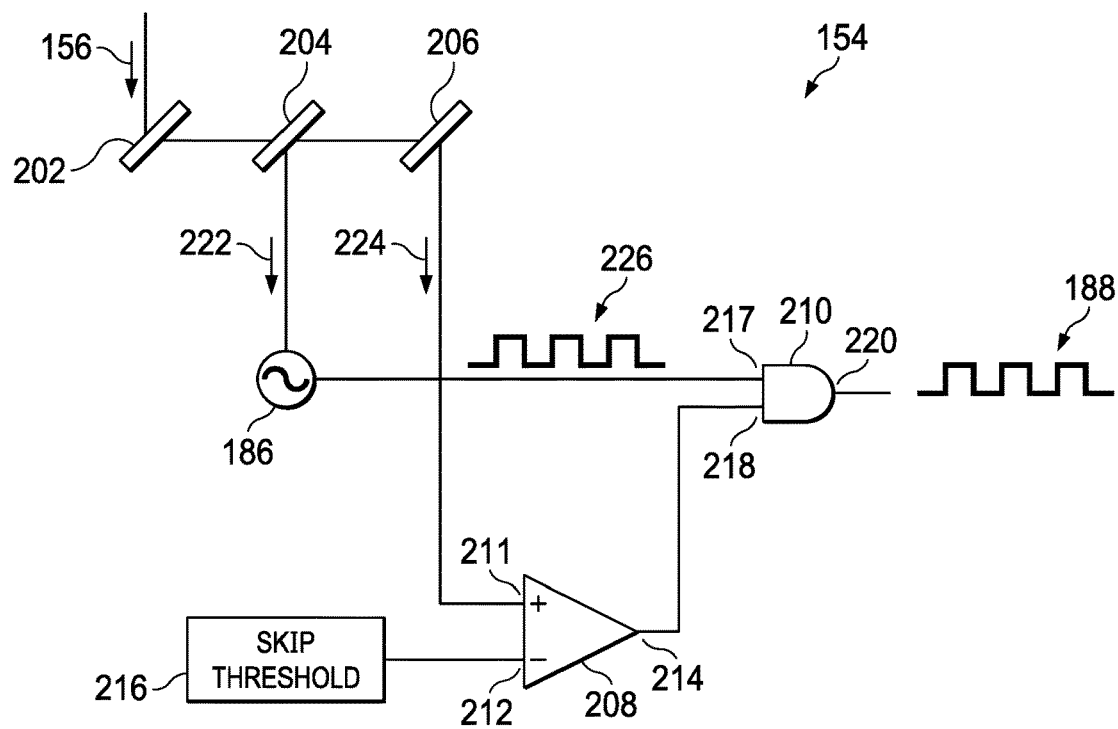
FIG. 2 is a circuit diagram of an oscillator control in accordance with various examples.

FIG. 2 is a circuit diagram of an oscillator control 154 in accordance with various examples herein. Oscillator control 154 is one example of a circuit for skipping pulses of oscillator 186. Other circuitry may be useful in other examples and fall within the scope of this description. Oscillator control 154 includes oscillator 186, current mirrors 202, 204, and 206, comparator 208, and AND gate 210. Comparator 208 includes a first input 211, a second input 212, and an output 214. Oscillator control 154 includes as skip threshold 216 coupled to second input 212 of comparator 208. AND gate includes a first AND gate input 217, a second AND gate input 218, and an AND gate output 220. Oscillator control 154 also includes a current 156, current 222, current 224, waveform 226, and clock signal 188.

In an example, current 222 is the control current for oscillator 186. Oscillator 186 is a current-controlled oscillator in this example. As current 222 increases, the frequency of oscillator 186 increases. As current 222 decreases, the frequency of oscillator 186 decreases. A specific current produces a specific frequency for oscillator 186. For example, a 5 microamp current may produce a frequency of 1.5 MHz, while a 5 nanoamp current may produce a frequency of 1.5 kHz. The frequency may be linearly dependent (or nearly linearly dependent) on the value of the current in some examples.

Current mirrors 202, 204, and 206 are present in oscillator control 154. Current 156 (from V2I 152, shown in FIG. 1) enters oscillator control 154. Current 156 is mirrored by current mirrors 202, 204, and 206, which produces currents 222 and 224. Currents 222 and 224 are mirrors of current 156. Therefore, as the current from V2I 152 increases, the current 222 provided to oscillator 186 increases, as described above.

Skip threshold 216 is a reference current that represents the predetermined minimum frequency that oscillator 186 will run at. For example, the skip threshold 216 may be 500 nanoamps, which in this example corresponds to a frequency of 150 kHz. Therefore, 150 kHz is the minimum frequency for oscillator 186; to generate frequencies below that level for light loads, pulses from oscillator 186 are skipped.

Current 224 is a mirror of the oscillator current 222 and is provided to first input 211 of comparator 208. Skip threshold 216 is provided to second input 212 of comparator 208. If current 222 and current 224 are above the skip threshold of 500 nanoamps, comparator 208 produces a high signal at output 214, which is provided to AND gate 210 at second AND gate input 218. Therefore, AND gate 210 will pass or provide the pulses of waveform 226 if current 224 is above the skip threshold 216. Passing refers to providing a pulse or pulses of waveform 226 to other circuitry. In this example, clock signal 188 (provided to latch 164 in FIG. 1) will match waveform 226 as long as the oscillator current 222 stays above the skip threshold 216.

If load 120 (not shown in FIG. 2) is a light load, $V_{out}$ at node 106 drops, and current 156 from V2I 152 drops as well. Current 224 also drops. If current 224 drops, it may fall below the value of skip threshold 216. If current 224 drops below the value of skip threshold 216, comparator 208 produces a 0 value at output 214. The 0 value is provided to second AND gate input 218 of AND gate 210, and AND gate 210 produces a 0 value at AND gate output 220, irrespective of the value at first AND gate input 217. Therefore, pulses from waveform 226 may be skipped and not appear in clock signal 188 if current 224 is below skip threshold 216. If these pulses are skipped, the pulses that make up clock signal 188 will have a lower frequency than the minimum frequency of oscillator 186. Pulses will continue to be skipped as long as current 224 is below skip threshold 216. If the load 120 stays low, the frequency of clock signal 188 remains low. The feedback mechanisms described above with respect to FIG. 1 provides a steady state operation, where the frequency of clock signal 188 is sufficient to drive the load 120. The frequency of clock signal 188 may therefore fall to a low value responsive to a light load, such as 10 Hz, while oscillator 186 remains operating at a higher frequency.

The control loop described above with respect to FIG. 1 adjusts the frequency of clock signal 188 responsive to changes in load 120. For example, if oscillator control 154 is currently skipping every other pulse, but the load 120 drops, oscillator control 154 will skip more pulses, such as two out of every three pulses. Responsive to the change in load 120, $V_{out}$ increases because the voltage converter is providing more current to load 120 than needed. Error value 150 increases, and V2I 152 translates the error value 150 into current 156 for oscillator 186. Current 222 also increases, which causes current 224 to increase. Current 224 is sent to comparator 208, and as current 224 exceeds skip threshold 216, comparator 208 provides a high value at its output and AND gate 210 releases or provides (e.g., passes) a pulse at AND gate output 220.

The pulses may be skipped with any suitable pattern in examples herein. For example, if oscillator 186 is running at 1000 Hz, skipping every other pulse would produce a pulse train with a frequency of 500 Hz. Alternatively, the circuitry could release two pulses, then skip two pulses, then release two pulses, then skip two pulses, etc. This pattern of releasing two pulses followed by skipping two pulses would also result in a frequency of 500 Hz. In another example, the circuitry could release ten pulses, then skip ten pulses, then release ten pulses, etc. Over a longer time period, those pulses would also create a waveform with an average frequency of 500 Hz. In another example, 100 pulses could be released, followed by 100 skipped pulses, etc. Any pattern for skipping pulses is useful in other examples.

Also, skipping pulses allows any frequency to be achieved. For example, if oscillator 186 is running at 1000 Hz, one pulse could be released, followed by skipping nine pulses, and then repeating. The resulting waveform would have a frequency of 100 Hz. If oscillator 186 is running at 1000 Hz, one pulse could be released, followed by skipping 99 pulses, and then repeating. The resulting waveform would have a frequency of 10 Hz. Therefore, any frequency can be achieved by employing the appropriate pattern of skipping pulses.

FIG. 2 shows one example of circuitry for skipping oscillator pulses to produce a clock signal 188 with a lower frequency. Any suitable techniques is useful for skipping pulses. Other circuitry or digital logic may be useful in other examples. Other circuit components, such as digital controllers, analog circuitry, or different combinations of logic gates are useful to skip oscillator pulses responsive to changes in a load 120. FIG. 2 is merely one example of the techniques described herein.

Figure 3:
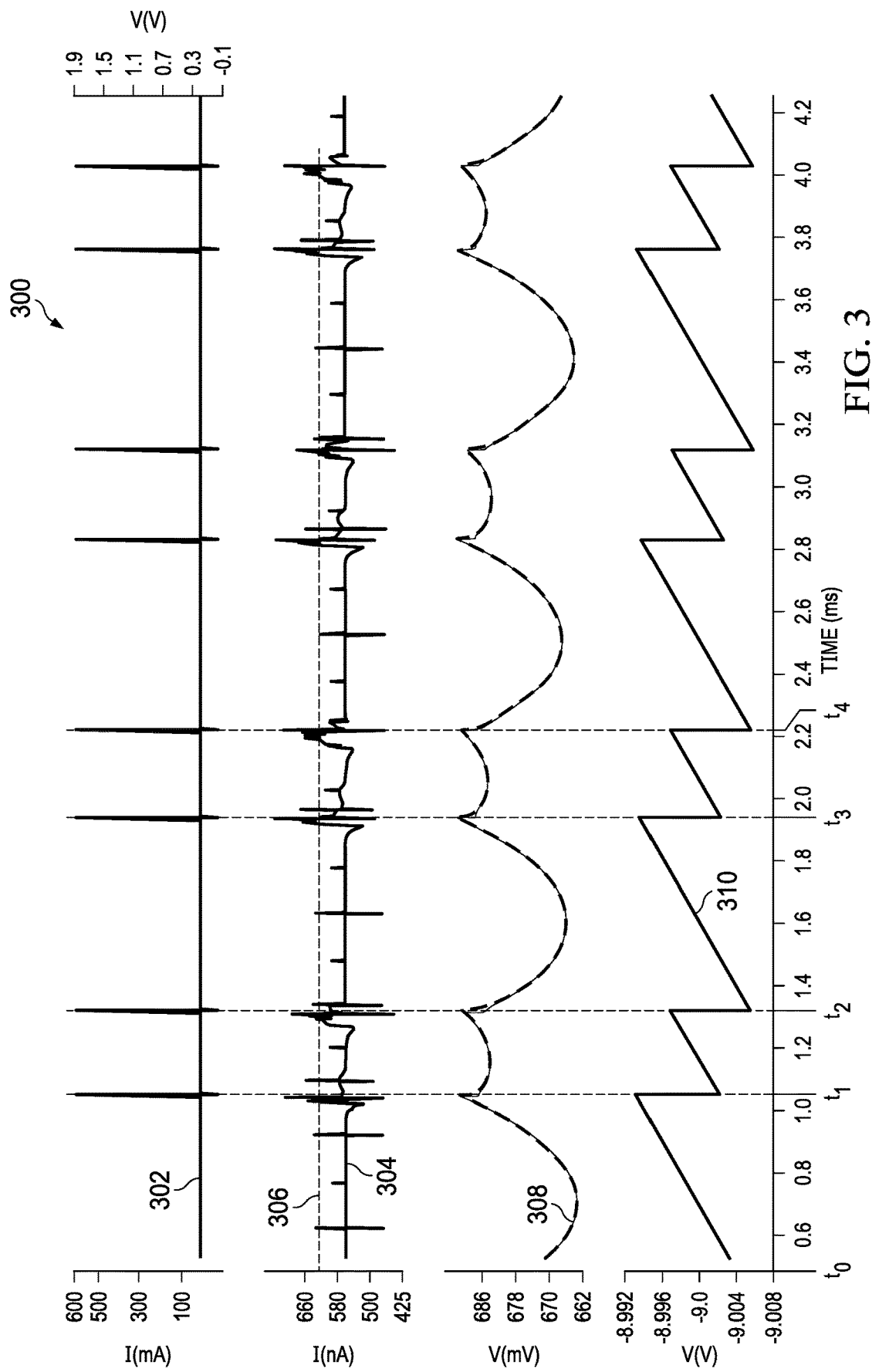
FIG. 3 is a collection of waveforms for a pulse-skipping PFM-based switching voltage converter in accordance with various examples.

FIG. 3 is a collection of waveforms 300 for a pulse-skipping PFM-based switching voltage converter in accordance with various examples herein. The x-axis for each waveform indicates the time in milliseconds. Waveform 302 is the inductor current (e.g., output inductor 116) in milliamps. Waveform 304 is the oscillator current 222 in nanoamps. Waveform 306 is a horizontal dashed line that represents the skip threshold 216 in nanoamps. Waveform 308 is the error value 150 in millivolts. Waveform 310 is the output voltage $V_{out}$ in volts.

The waveforms begin at time $t_0$. At time $t_0$, the output voltage $V_{out}$ (waveform 310) begins to rise. Error value 150 (waveform 308) drops slightly but also begins to rise at the time approaches $t_1$. As described above with respect to FIG. 1, as $V_{out}$ rises, the error value 150 from comparator 136 also rises. As error value 150 rises, the current 156 from V2I 152 also increases. The rise in current 156 causes an increase in oscillator current 222 (represented by waveform 304). At time $t_1$, oscillator current 222 crosses the skip threshold 216 (represented by waveform 306). If oscillator current 222 crosses the skip threshold, a pulse from oscillator 186 is released by AND gate 210 and provided to latch 164. Waveform 302 shows that the inductor current jumps at time $t_1$, which indicates a pulse from oscillator 186 was received at latch 164 and high-side FET 108 was turned on which caused the current to increase through output inductor 116. Also, at time $t_1$, output voltage $V_{out}$ drops as shown by waveform 310.

After time $t_1$, output voltage $V_{out}$ begins to rise again (waveform 310). Error value 150 (waveform 308) also rises. Oscillator current 222 (waveform 304) rises responsive to error value 150 rising. At time $t_2$, oscillator current 222 crosses skip threshold 216 (waveform 306), a pulse from oscillator 186 is released by AND gate 210. Waveform 302 shows that the inductor current jumps at time $t_2$, which indicates a pulse from oscillator 186 was received at latch 164 and high-side FET 108 was turned on, which caused the current to increase through output inductor 116. Also, at time $t_2$, output voltage $V_{out}$ drops as shown by waveform 310. Between times $t_2$ and $t_3$, as oscillator current 222 is lower than skip threshold 216, one oscillator pulse is skipped.

The collection of waveforms 300 indicate that additional oscillator pulses are released at times $t_3$ and $t_4$. The process for the release of those oscillator pulses is similar to that described above with respect to the pulses released at times $t_1$ and $t_2$. Additional pulses are also shown on the waveforms 300, and those pulses operate similarly to those described above.

Figure 4:
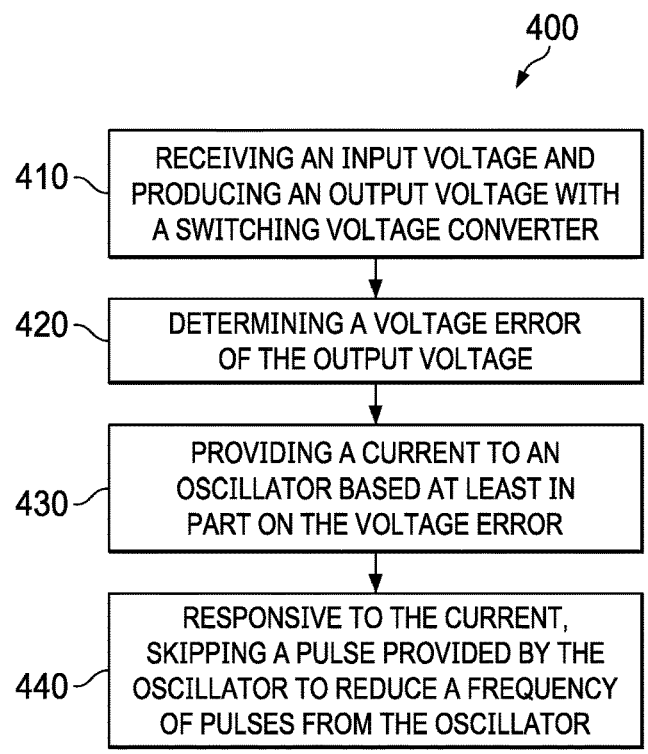
FIG. 4 is a flow diagram of a method for pulse skipping in a PFM-based switching voltage converter in accordance with various examples.

FIG. 4 is a flow diagram of a method 400 for pulse skipping in a PFM-based switching voltage converter in accordance with various examples herein. The steps of method 400 may be performed in any suitable order. The hardware components described above with respect to FIGS. 1-2 may perform method 400 in some examples.

Method 400 begins at 410, where a switching voltage converter receives an input voltage and produces an output voltage. As described above with respect to FIG. 1, the switching voltage converter may be a buck converter, a boost converter, or a buck-boost converter.

Method 400 continues at 420, where compensation circuitry determines a voltage error of the output voltage. The compensation scheme may be implemented with any appropriate circuitry. As described above, comparator 136 produces error value 150.

Method 400 continues at 430, where a current is provided to an oscillator based at least in part on the voltage error. In voltage converter 100, a voltage to current converter 152 receives the error value 150 and produces a current 156 that is provided to the oscillator.

Method 400 continues at 440 where, responsive to the current, a pulse provided by the oscillator is skipped to reduce a frequency of pulses from the oscillator. Any suitable circuitry is useful to skip the pulse. FIG. 2, described above, provides one example for skipping pulses. In that example, a current 224 is provided to comparator 208 and compared to a skip threshold 216. If current 224 is below skip threshold 216, a pulse is skipped. Any pattern of pulses may be skipped to provide an appropriate frequency of the pulses provided by oscillator 186.

By keeping the oscillator frequency at or above a minimum frequency and skipping pulses to provide lower frequencies, the oscillator as described herein can ramp up in frequency more quickly responsive to an increase in the load. Stability of the voltage converter is increased by the ability of the oscillator to quickly increase frequency responsive to the change in load. In examples herein, precise control of the oscillator is achieved, and the voltage converter exhibits a fast response to changes in the load. A copy of the oscillator current drives the comparator that determines whether pulses are skipped. Therefore, trimming is not needed to determine a voltage-based skip threshold as in conventional solutions.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection or ground terminal applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A system, comprising:
a switching voltage converter including a first field effect transistor (FET) and a second FET, the switching voltage converter configured to receive an input voltage and provide an output voltage;
a voltage to current converter coupled between the switching voltage converter and an oscillator, wherein the voltage to current converter is configured to receive an error voltage responsive to the output voltage and provide an oscillator current to the oscillator; and
a comparator coupled to the oscillator and configured to compare the oscillator current to a reference current, wherein an output of the comparator is configured to skip a pulse of an oscillator output responsive to the oscillator current being less than the reference current.

2. The system of claim 1, further comprising:
a current mirror configured to mirror the oscillator current and provide a copy of the oscillator current to the comparator.

3. The system of claim 1, wherein an output of the comparator is coupled to an AND gate, and the oscillator output is also coupled to the AND gate.

4. The system of claim 3, wherein the AND gate is configured to provide the pulse to a latch.

5. The system of claim 4, wherein the latch is coupled to a gate driver for the switching voltage converter.

6. The system of claim 5, wherein the latch is configured to reset responsive to a current at an output of the switching voltage converter exceeding a threshold.

7. The system of claim 5, wherein the gate driver is configured to control the first FET and the second FET.

8. The system of claim 1, wherein the output of the comparator is configured to skip more than one consecutive pulse responsive to a magnitude of the oscillator current.

9. The system of claim 1, wherein the comparator is configured to skip the pulse of the oscillator output to reduce a frequency of the switching voltage converter.

10. The system of claim 1, wherein the oscillator is configured to operate at a higher frequency than a frequency of the switching voltage converter.

11. The system of claim 1, wherein the output of the comparator is configured to skip the pulse of the oscillator output responsive to a magnitude of a load coupled to the switching voltage converter.

12. The system of claim 1, wherein the oscillator is configured to change a frequency of the oscillator responsive to a magnitude of the oscillator current.

13. A system, comprising:
a switching voltage converter including a first field effect transistor (FET), a second FET, and a gate driver coupled to a gate of the first FET and a gate of the second FET;
a voltage to current converter coupled to an output of the switching voltage converter;
an oscillator coupled to the voltage to current converter;
an AND gate having an AND gate output and first and second AND gate inputs, the AND gate output coupled to a latch, the first AND gate input coupled to the oscillator, and the second AND gate input coupled to a comparator, wherein the latch is coupled to the gate driver; and
a current mirror coupled to the voltage to current converter, the oscillator, and the comparator.

14. The system of claim 13, wherein the comparator has a comparator output and first and second comparator inputs, the comparator output coupled to the second AND gate input, the first comparator input coupled to a current mirror, and the second comparator input coupled to a reference current source.

15. A method, comprising:
receiving an input voltage and producing an output voltage with a switching voltage converter;
determining a voltage error of the output voltage;
converting the voltage error into a current proportional to the voltage error using a voltage-to-current converter;
providing the current to an oscillator; and
responsive to the current, skipping a pulse provided by the oscillator to reduce a frequency of pulses from the oscillator.

16. The method of claim 15, further comprising:
responsive to the current, passing the pulse provided by the oscillator to maintain the frequency of pulses from the oscillator.

17. The method of claim 15, further comprising:
comparing the current to a skip threshold current to determine whether to skip a pulse provided by the oscillator.

18. The method of claim 15, further comprising:
providing the pulse from the oscillator to a latch that controls a gate driver of the switching voltage converter.

19. The method of claim 15, wherein the voltage error changes responsive to a change in a load of the switching voltage converter.

* * * * *